US011248768B2

(12) United States Patent
Aubert et al.

(10) Patent No.: US 11,248,768 B2
(45) Date of Patent: Feb. 15, 2022

(54) TRANSPARENT OPTICAL ELEMENT FOR A MOTOR VEHICLE

(71) Applicant: VALEO VISION, Bobigny (FR)

(72) Inventors: Nicolas Aubert, Taverny (FR); Marc Brassier, Le Perreux sur Marne (FR); Damien Revol, Paris (FR)

(73) Assignee: VALEO VISION, Bobigny (FR)

( * ) Notice: Subject to any disclaimer, the term of this patent is extended or adjusted under 35 U.S.C. 154(b) by 1296 days.

(21) Appl. No.: 15/446,127

(22) Filed: Mar. 1, 2017

(65) Prior Publication Data
US 2017/0254502 A1    Sep. 7, 2017

(30) Foreign Application Priority Data

Mar. 1, 2016   (FR) ...................... 16 51716

(51) Int. Cl.
| G02B 1/18 | (2015.01) |
| F21S 45/50 | (2018.01) |
| C23C 16/30 | (2006.01) |
| C23C 30/00 | (2006.01) |
| G02B 1/04 | (2006.01) |
| F21W 107/10 | (2018.01) |

(52) U.S. Cl.
CPC ............ F21S 45/50 (2018.01); C23C 16/308 (2013.01); C23C 30/00 (2013.01); G02B 1/04 (2013.01); G02B 1/18 (2015.01); *F21W 2107/10* (2018.01)

(58) Field of Classification Search
CPC ........ F21S 45/50; C23C 16/308; C23C 30/00; G02B 1/18; G02B 1/04; G02B 1/10; F21W 2107/10
See application file for complete search history.

(56) References Cited

U.S. PATENT DOCUMENTS

| 5,246,768 A | 9/1993 | Rostaing et al. |
| 2001/0031365 A1* | 10/2001 | Anderson ......... B32B 17/10174 |
| | | 428/432 |

FOREIGN PATENT DOCUMENTS

| CN | 103882405 A | 6/2014 |
| DE | 100 12 516 C1 | 12/2001 |
| DE | 10 2012 112780 B3 | 5/2014 |
| EP | 0 455 551 A1 | 11/1991 |

OTHER PUBLICATIONS

Kim et al. "Nitrogen-doped SiO2/TiO2 core/shell nanoparticles as highly efficient visible light photocatalyst", Catalysis Communications, vol. 11, 2010, pp. 378-382. (Year: 2010).*
Langhuan et al., "Preparation of Nitrogen-Doped TiO2/SiO2 Microspheres with Core-Shell Structure and Their Photocatalytic Activity under Visible Light", Chinese Journal of Catalysis, col. 27, No. 12, 2006, pp. 1101-1106. (Year: 2006).*
Search Report dated Oct. 28, 2016 in French Patent Application No. FA823420 FR1651716 (with English translation of category of cited documents).
Combined Chinese Office Action and Search Report dated Dec. 9, 2019, in Patent Application No. 201710118962.0, 15 pages (with summarized English translation and English Translation of Category of Cited Documents).
Combined Chinese Office Action and Search Report dated Sep. 21, 2020 in corresponding Chinese Patent Application No. 201710118962.0 (with English Translation and English Translation of Category of Cited Documents), 12 pages.

* cited by examiner

*Primary Examiner* — Jonathan C Langman
(74) *Attorney, Agent, or Firm* — Oblon, McClelland, Maier & Neustadt, L.L.P.

(57) ABSTRACT

A transparent optical element for a motor vehicle includes at least one first transparent layer of a polymer material. The optical element further has at least one second transparent layer including at least silicon, titanium, oxygen and nitrogen.

12 Claims, No Drawings

TRANSPARENT OPTICAL ELEMENT FOR A MOTOR VEHICLE

The present invention pertains to a transparent optical element for a motor vehicle comprising at least one layer based on silicon, titanium, oxygen and nitrogen, as well as a method for fabrication of said optical element.

It applies typically, but not exclusively, to the fields of optics, particularly optical articles of automotive glazing type, such as for example lighting devices and light signaling of motor vehicles.

The lighting devices of a motor vehicle, such as for example a headlight or a rear light, typically comprise a housing and a transparent outer lens for closing off the housing. This transparent closure outer lens may have anti-fog or anti-condensation properties, particularly thanks to an acrylic varnish applied to the internal face of the transparent closure outer lens.

However, the varnish applied has a relatively large ability to absorb water, causing water to be stored up inside the lighting device. As a result, when this residual water evaporates, zones of water saturation or water dripping, known as "water sagging", may be formed on the surface of the transparent closure outer lens. These zones of water saturation, at very low temperatures, may damage the varnish and cause micro cracks, thus degrading its antifog properties and rendering the transparent closure outer lens unfit for use in an operating configuration.

Finally, the thickness of this varnish applied to the interior surface of the transparent closure outer lens might not be homogeneous over the entire surface so treated, and therefore the antifog properties will be affected.

The purpose of the present invention is to mitigate the drawbacks of the prior art by proposing a transparent optical element for a motor vehicle which significantly limits, or even prevents, zones of water dripping while ensuring good antifog properties over time, especially for a period of at least two years.

The subject matter of the present invention is a transparent optical element for a motor vehicle comprising at least one first transparent layer of a polymer material, characterized in that the optical element further comprises at least one second transparent layer comprising at least silicon, titanium, oxygen and nitrogen.

Thanks to the invention, the optical element in operational configuration presents an optimized photocatalytic activity while assuring very good antifog properties and significantly limiting, if not preventing, the formation of water dripping. Furthermore, the optical element of the invention is easy to fabricate and guarantees homogeneous properties over the entire surface treated with the second layer.

The photocatalytic activity allows chemical reactions to occur in the presence of light. Its principle is based on the generating of electron-hole pairs in a semiconductor material by absorption of photons whose energy is at least equal to the width of the forbidden band of the material. These charge carriers will then react with chemical species on the surface of the material by oxidizing photocatalysis.

More particularly, the photocatalytic activity of the optical element of the invention can be realized at wavelengths A ranging from 380 nm to 780 nm (visible light), and preferably at wavelengths A greater than or equal to 400 nm.

In the present invention, by "transparent element or transparent layer" is meant an element or a layer transmitting light by refraction and through which objects are more or less clearly visible. More particularly, it is an element or a layer through which an image is observed without significant loss of contrast: the interposition of said transparent element or said transparent layer between an image and an observer of that image does not significantly reduce the image quality. In fact, in the sense of the invention, a transparent element can transmit at least a portion of the incident light (or incident light beam) with little or no dispersion. Preferably, the luminous transmission, especially the transmission of visible light, through the transparent element or transparent layer is at least 87%. The luminous transmission is the quantity of light which the transparent element or transparent layer lets pass through from an incident light beam.

Once the second transparent layer has been deposited on the first layer, the color of the first layer is visible through the second layer. The transparency of the second layer is such that the color of the first layer, perceived through the second layer, is substantially the same as the color of the first layer. The same color means that the variation in the parameters L*a*b by the CIE Lab method obeys in particular the following values: $\Delta L \leq 2.0$, $\Delta a \leq 1.0$, $\Delta b \leq 1.0$, the parameter L* defining the clarity and the parameters a* and b* defining the chromaticity.

The second layer of the invention may comprise 30% to 90% by weight of silicon, and preferably 40% to 70% by weight of silicon, in relation to the total weight of the second layer.

The second layer of the invention may comprise 1% to 70% by weight of titanium, and preferably 5% to 30% by weight of titanium, in relation to the total weight of the second layer.

The second layer of the invention may comprise 40% to 60% by weight of oxygen, and preferably 45% to 55% by weight of oxygen, in relation to the total weight of the second layer.

The second layer of the invention may comprise 0.0001% to 5% by weight of nitrogen, and preferably 0.02% to 0.1% by weight of nitrogen, in relation to the total weight of the second layer.

The determination of the different percentages by weight as indicated above can be done in the classical manner by elemental analysis spectroscopy, such as XPS (X Photoelectron Spectroscopy). The analysis of the structure is done by SEM/EDS (Scanning Electron Microscope with probe for Energy Dispersion Spectroscopy).

The Second Layer

The second layer of the invention may comprise:
one or more silicon-oxygen (Si—O) groups,
one or more titanium-oxygen (Ti—O) groups, and
one or more titanium-nitrogen (Ti—N) groups.
In the present invention, we understand by:
"silicon-oxygen group": a group comprising at least one atom of silicon covalently bonded to one atom of oxygen (Si—O);
"titanium-oxygen group": a group comprising at least one atom of titanium covalently bonded to one atom of oxygen (Ti—O); and
"titanium-nitrogen group": a group comprising at least one atom of titanium covalently bonded to one atom of nitrogen (Ti—N).

In one particular embodiment of the invention, the second layer may comprise a nitrogen derivative of titanium dioxide, and more particularly, a derivative of titanium dioxide doped with nitrogen. Preferably, the nitrogen derivative of titanium dioxide has the formula $TiO_{2-x}N_x$ with $0.001 < x < 1.00$, preferably with $0.01 \leq x \leq 0.10$, and more preferably with $x = 0.02$.

In the present invention, the second layer may be obtained from at least one precursor PR1 containing oxygen and silicon, and at least one precursor PR2 containing oxygen and titanium.

By "precursor" is meant any compound, by itself or in combination, making it possible to obtain the second layer.

More particularly, the precursor PR1 can be chosen from among a hydrocarbon silane, a fluorosilane, an organosilicate, a monomer of siloxane, silicon dioxide ($SiO_2$), or one of their mixtures.

The hydrocarbon silane can be tetramethysilane (TMS).

The fluorosilane can be triethoxyfluorosilane (TEOF).

The organosilicate can be chosen from among tetraethyl orthosilicate (TEOS), tetramethyl orthosilicate (TMOS), or one of their mixtures.

Said monomer of siloxane can be chosen for example from among hexamethyl disiloxane (HMDSO), tetramethyl disiloxane (TMDSO), octamethyl cyclotetrasiloxane (OMCTSO), or one of their mixtures.

In the present invention, the precursor PR2 can be titanium tetraisopropoxide (TTIP) or one of its derivatives, titanium diisopropoxide bis(acetylacetonate) (TIPO), tetrabutyl orthotitanate (TBOT), tetrapropyl orthotitanate (TPOT), ammonium citratoperoxotitanate, tetrakis (9H-carbazole-9-yl-ethyl-oxy) titanium (Ti(OeCarb)$_4$), titanium dioxide ($TiO_2$), or one of their mixtures.

One may mention as examples of derivatives of TTIP:
titanium acetyl acetonate tris isopropoxide (TAATIP),
TTIP modified by ethylene glycol (EGMT), or
TIP modified by acetic acid (HOAc/TTIP or $C_2H_4O_2$: TTIP).

The dopant N can be substituted in part by at least one of the following nonmetallic elements: carbon (C), phosphorus (P), fluorine (F), sulfur (S), and/or by at least one of the following metallic elements: zinc (Zn), copper (Cu), silver (Ag), iron (Fe), cobalt (Co). A mixture of these compounds is possible to achieve a co-doping, for example by combining fluorine (F) with nitrogen (N) or carbon (C) with nitrogen (N).

The second layer according to the invention may have a thickness of at most 100 nm, and preferably a thickness ranging from 30 to 85 nm.

In the present invention, the second layer can be deposited directly on the surface of the first layer. Accordingly, the second layer is directly in physical contact with the first layer.

According to another embodiment, the second layer can be deposited indirectly on the surface of the first layer. Accordingly, one or more additional layers may be intercalated between the first layer and the second layer. Thus, the second layer is not directly in physical contact with the first layer.

In a particularly preferred embodiment, the second layer can be a hydrophilic layer.

In the present invention, one understands by "hydrophilic" a material or a layer whose surface presents an angle of contact (or droplet angle) strictly less than 80°, and preferably greater than or equal to 10°. More particularly, one understands by superhydrophilic a material whose surface presents an angle of contact less than 10°.

The measurement of the angle of contact takes account of the ability of a liquid to spread out over a surface by wettability. The method consists in measuring the angle of the tangent to the profile of a droplet placed on the material or the layer which it makes with the surface of the material or the layer.

This angle of contact is typically measured with the aid of a goniometer, at 25° C., using distilled water.

The First Layer

The optical element of the invention comprises one or more first transparent layers of a polymer material, or in other words it comprises one or more first transparent layers comprising a polymer material.

The first layer may comprise at least 50% by weight of polymer material, preferably at least 60% by weight of polymer material, and in particularly preferred manner at least 80% by weight of polymer material, in relation to the total weight of the first layer.

In one particular embodiment, the first transparent layer may consist solely of said polymer material.

The polymer material of the first layer may comprise at least one polymer P chosen from among polycarbonate (PC), high temperature modified polycarbonate (PC-HT), polymethyl methacrylate (PMMA), polymethacrylimide (PMMI), cyclo-olefin polymer (COP), cyclo-olefin copolymer (COC), polysulfone (PSU), polyarylate (PAR), transparent polyamide (PA), or mixtures thereof.

The polymer material may comprise at least 50% by weight of the polymer P, preferably at least 60% by weight of the polymer P, and in particularly preferred manner at least 80% by weight of the polymer P, in relation to the total weight of the polymer material.

In one particular embodiment, the polymer material may consist solely of one or more polymers P.

The first layer according to the invention may have a thickness of at least 1.0 mm, and preferably at least 2.5 mm. Furthermore, it may have a thickness of at most 5 mm, and preferably at most 3.5 mm.

The Optical Element

The transparent optical element of the invention may be of the automotive glazing type, and may be part of a lighting device, for example, such as a lighting and/or signaling device of a motor vehicle.

More particularly, the transparent optical element may be a closure outer lens of a lighting device, such as the outer lens of a front headlight or the outer lens of a rear light of a motor vehicle.

The closure outer lens of a lighting device may comprise an interior face and an exterior face, the exterior face being the one in direct contact with the outer surroundings or in other words the layer directly exposed to outside aggressions.

In one particularly preferred embodiment, the first layer of the optical element of the invention can be the exterior face of said closure outer lens, in the lighting device.

Moreover, the second layer may be the interior face of said closure outer lens, in the lighting device.

Another subject matter of the invention concerns a lighting device of a motor vehicle comprising the transparent optical element according to the invention.

In particular, the device of the invention may comprise a housing forming a volume in which a light source and/or a light module can be lodged, the optical element closing off said housing.

The Method of Fabrication of the Optical Element

Another subject matter of the invention is a method of fabrication of the optical element according to the invention characterized in that the second transparent layer can be formed by at least one method chosen from among flame treatment, chemical vapor phase deposition, physical vapor phase deposition, and low-pressure deposition of an atomic layer.

The optical element of the invention is easy to fabricate and guarantees homogeneous properties over the entire surface treated with the second layer.

According to a first embodiment, the second transparent layer can be formed by flame treatment.

The method of flame treatment consists in exposing the surface being treated to a flame.

The flame of this method is typically a flame formed by a mixture of at least one fuel and at least one oxidant (i.e., fuel/oxidant mixture), this type of technique being well known to the skilled person.

The method of flame treatment can be, for example, the "one-step flame/spray pyrolysis" (FSP) type.

According to a second embodiment of the method of the invention, the second layer can be formed by chemical vapor phase deposition (CVD), in particular assisted by plasma.

According to a first variant of the second embodiment, the chemical deposition assisted by plasma can be the method known as "Plasma-Enhanced Chemical Vapor Deposition" (PECVD) to designate so-called "off-equilibrium" methods. This type of deposition is done under vacuum, more precisely, under low pressure (of the order of 1 to 10 Pa or $10^{-2}$ to $10^{-1}$ mbar).

According to a second variant of the second embodiment, the chemical deposition assisted by plasma can be carried out under atmospheric pressure (APCVD). One then speaks of so-called "off-equilibrium" plasma at atmospheric pressure or "cold" plasma.

One can also mention other types of CVD methods, such as for example laser-assisted CVD deposition (LECVD) or CVD deposition based on metal oxide(s) (MOCVD: "Metal Organic CVD", PP-MOCVD: "Pulse Pressure MOCVD").

According to a third embodiment, the deposition can be done by physical vapor phase deposition (PVD), and more particularly by cathode sputtering, in sequential or simultaneous mode.

According to a first variant of the third embodiment, the deposition can be done by DC cathode sputtering, more particularly, by magnetron cathode sputtering, starting with a silicon target and a titanium target, by introducing the necessary reactive gases ($O_2$ and $N_2$ for example).

According to a second variant of the third embodiment, the deposition can be done by AC medium or radio frequency cathode sputtering, starting with oxide targets $SiO_2$ and $TiO_2$, with controlled introduction of nitrogen ($N_2$) by a mass flow meter during the depositing of the layer of $TiO_2$.

According to other variants, the cathode sputtering deposition can be done in continuous or pulsed mode.

According to a fourth embodiment, the depositing can be done by depositing an atomic layer under low pressure (ALD: "Atomic Layer Deposition"), using for example TTIP and water as the precursors.

Other embodiments are possible by liquid deposition using the same precursors: "spin coating" (coating by centrifugation) or "dip coating", which generally require a heat treatment to obtain a layer structure having the necessary functionalities. However, these methods are not compatible with thermoplastic substrates such as those forming the first layer.

The preferred but not the only method is a deposition by atmospheric plasma (second variant of the second embodiment).

In this method, the values of the flow rates of the different components may vary within the following limits:

Precursor PR1: from 0.001 $ml_s$/min to 10 $l_s$/min;
Precursor PR2: from 0.01 $ml_s$/min to 10 $l_s$/min;
Dopant (nitrogen or nitrogenated mixture): from 0.1 $ml_s$/min to 100 $l_s$/min;
Oxidizing carrier gas (air or oxygen): from 1 $ml_s$/min to 100 $l_s$/min.

The unit $ml_s$/min means "standard milliliter per minute", and the unit $l_s$/min means "standard liter per minute", the standard conditions corresponding to a pressure of 1013 mbar and a temperature of 20° C.

Other characteristics and advantages of the present invention will appear in the light of the description of nonlimiting examples.

EXAMPLE

Fabrication of an Optical Element According to the Invention

The support used as the first layer is a transparent polycarbonate (PC), marketed by the company KUDEB under the brand M.AL2447. This polycarbonate is in the form of a rectangular sheet with the following dimensions: 15 cm in length, 10.5 cm in width, and 3.2 mm in thickness.

The following compounds were used:
PR1: TEOS marketed by the company Sigma Aldrich under the brand 86578 purity ≥99% (CAS No. 78-10-4);
PR 2: TTIP marketed by the company Sigma Aldrich under the brand 87560 purity≥97% (CAS No. 546-68-9); and
The nitrogen used as the carrier and dopant gas is marketed by the company Air Liquide under the brand Alphagaz 1 Azote (CAS No. 7727-37-9).

The atmospheric plasma method is carried out.

The power of the generator powering the electrode is 1000 Watts. The mass flow rate of precursor PR1 TEOS is 1.5 $ml_s$/min and the flow rate of precursor PR2 TTIP is 0.1 $ml_s$/min, the flow rate of the dopant gas ($N_2$) is 50 $ml_s$/min, the flow rate of air ($O_2$) is 100 mLm. The distance between the nozzle and the substrate is 15 mm. The rate of deposition is set at 100 mm per second.

One thus obtains a first layer of PC comprising a second layer of silicon, titanium, oxygen and nitrogen, deposited directly on its surface, the second layer having a thickness of around 85 nm.

This second layer is characterized by a structure of "core/shell" type, in which at least one particle of $SiO_2$ is covered by a shell of nanoparticles of $TiO_{2-x}N_x$ distributed on the surface of said particle of $SiO_2$. The ratio of the mean diameter of the nanoparticles of $TiO_{2-x}N_x$ to the mean diameter of the particles of $SiO_2$ is around 1:10. This structure was characterized by using SEM/EDS (scanning electron microscope outfitted with a probe).

Various tests were conducted on the piece so treated:

1—Evaluation of the Anti-Condensation Effect:

The samples were placed above a kettle containing water for one minute and then laid flat and left for 10 minutes at 60° C. The samples were then left for 3 days at room temperature (23° C.) in an unconfined atmosphere. The test of exposure to the kettle is repeated (20 times). Observation shows there is no visible condensation in the zone treated according to the invention whereas it is very visible, with formation of droplets of condensed water, on a specimen not treated according to the invention.

2—Climate Cycles

The samples were placed:
for 16 hours at 85° C. in an atmosphere with relative humidity of 95%, then for 3 hours at −20° C. in a dry atmosphere (relative humidity equal to 0%), and finally for 6 hours at 85° C. in an atmosphere with relative humidity less than 30%.

The cycle is repeated 5 times. No alteration or modification of the appearance of the treatment was observed.

3—Angle of Contact

The angle of contact with distilled water is less than 10°, showing the elevated level of hydrophilia of the second layer realized according to the invention ("superhydrophilia"). This characteristic is preserved after tests 1 and 2.

The invention claimed is:

1. A transparent optical element, for a motor vehicle comprising at least one first transparent layer of a polymer material, wherein the optical element further comprises at least one second transparent layer comprising at least silicon, titanium, oxygen and nitrogen.

the second layer comprises a nitrogen derivative of titanium dioxide of formula:

$TiO_{2-x}N_x$ with $0.001 < x < 1.00$, and the second layer has a core/shell structure wherein at least one particle of $SiO_2$ is covered by a shell of nanoparticles of $TiO_{2-x}N_x$ distributed on a surface of said particle of $SiO_2$.

2. The optical element according to claim 1, wherein the second layer comprises:

one or more silicon-oxygen (Si—O) groups, one or more titanium-oxygen (Ti—O) groups, and one or more titanium-nitrogen (Ti—N) groups.

3. The optical element according to claim 1, wherein $0.01 \leq x \leq 0.10$.

4. The optical element according to claim 1. wherein the second layer has a. thickness of at most 100 nm.

5. The optical element according claim 1, wherein the second layer is a hydrophilic layer.

6. The optical element according to claim 1, characterized in that wherein the second layer is directly in physical contact with the first layer.

7. The optical element according to claim 1, wherein the polymer material of the first layer comprises at least one polymer P chosen from among polycarbonate (PC), high temperature modified polycarbonate (PC-HT), polymethyl methacrylate (PMMA), polymethacrylimide (PMMI), cyclo-olefin polymer (COP), cyclo-olefin copolymer (COC), polysulfone (PSU), polyarylate (PAR), transparent polyarmide (PA), and mixtures thereof.

8. The optical element according to claim 1, wherein the element is a closure outer lens of a lighting device.

9. The optical element according to claim 8, wherein the closure outer lens of a lighting device comprises an interior face and an exterior face, the first layer being the exterior face of the closure outer lens.

10. The optical element according to claim 1, wherein a ratio of a mean diameter of the nanoparticles of $TiO_{2-x}N_x$ to a mean diameter of the particles of $SiO_2$ is abo 1:10.

11. The optical element according to claim 1, wherein the first transparent layer has a thickness of 1.0 mm to 5 mm.

12. A lighting device of a motor vehicle, comprising the transparent optical element according to claim 1.

* * * * *